(12) United States Patent
Zhang et al.

(10) Patent No.: US 11,012,150 B2
(45) Date of Patent: May 18, 2021

(54) AUTONOMOUS FAILURE RECOVERY METHOD AND SYSTEM FOR FIBER-OPTIC COMMUNICATION SYSTEM

(71) Applicant: COMBA TELECOM SYSTEMS (CHINA) LIMITED, Guangzhou (CN)

(72) Inventors: Wen Zhang, Guangzhou (CN); Hui Lv, Guangzhou (CN)

(73) Assignee: COMBA TELECOM SYSTEMS (CHINA) LIMITED, Guangdong (CN)

( * ) Notice: Subject to any disclaimer, the term of this patent is extended or adjusted under 35 U.S.C. 154(b) by 0 days.

(21) Appl. No.: 16/763,760

(22) PCT Filed: Nov. 15, 2018

(86) PCT No.: PCT/CN2018/115736
§ 371 (c)(1),
(2) Date: Jun. 17, 2020

(87) PCT Pub. No.: WO2019/096227
PCT Pub. Date: May 23, 2019

(65) Prior Publication Data
US 2021/0028856 A1    Jan. 28, 2021

(30) Foreign Application Priority Data
Nov. 17, 2017    (CN) .......................... 201711146573.5

(51) Int. Cl.
*H04B 10/03*    (2013.01)
*H04B 10/077*    (2013.01)
*H03L 7/08*    (2006.01)

(52) U.S. Cl.
CPC .............. *H04B 10/03* (2013.01); *H03L 7/08* (2013.01); *H04B 10/0773* (2013.01); *H04B 10/0779* (2013.01)

(58) Field of Classification Search
CPC ..................................................... H04B 10/03
See application file for complete search history.

(56) References Cited

U.S. PATENT DOCUMENTS

2007/0140322 A1*  6/2007  Wang ................... H04L 27/2675
                                                  375/149
2011/0179315 A1    7/2011  Yang
                    (Continued)

FOREIGN PATENT DOCUMENTS

CN    101997815 A    3/2011
CN    102118193 A    7/2011
                    (Continued)

OTHER PUBLICATIONS

International Search Report and Written Opinion from International Application No. PCT/CN2018/115736 dated Feb. 12, 2019.

*Primary Examiner* — Shi K Li
(74) *Attorney, Agent, or Firm* — Dorsey & Whitney LLP (57) ABSTRACT

An autonomous failure recovery method and a system for a fiber-optic communication system. The method comprises acquiring a real-time operation timing sequence of a digital high-speed serial transceiver of a fiber-optic communication system, and comparing the operation timing sequence against a pre-stored reference timing sequence of normal operation of the serial transceiver; when the operation timing sequence is inconsistent with the reference timing sequence, determining that failure of an optical path of the fiber-optic communication system has occurred; sending a pre-determined autonomous recovery timing sequence to the serial transceiver when the optical path is in a failure state, and performing an autonomous failure recovery operation of the fiber-optic communication system in response to the autonomous recovery timing sequence. The method and the system for a fiber-optic communication system achieve automatic troubleshooting and autonomous failure recovery (Continued)

S1: Acquire a real-time operation timing of a digital high-speed serial transceiver of the optical fiber communications system, and compare the operating timing with a pre-stored reference timing of normal operation of the digital high-speed serial transceiver S2: Determine a failure of an optical path of the fiber-optic communication system occurs when the operation timing is inconsistent with the reference timing S3: Transmit when the optical path is in a failure state, a pre-determined autonomous recovery timing to the digital high-speed serial transceiver, and perform an autonomous failure recovery operation of the fiber-optic communication system in response to the autonomous recovery timing for an optical path failure, thereby improving efficiency of troubleshooting and system recovery.

19 Claims, 7 Drawing Sheets

(56) References Cited

U.S. PATENT DOCUMENTS

| | | | |
|---|---|---|---|
| 2011/0249718 A1* | 10/2011 | Zerbe | ........................ H03L 7/07 375/226 |
| 2016/0380694 A1 | 12/2016 | Guduru | |
| 2020/0366596 A1* | 11/2020 | Licardie | ................ H04W 24/04 |

FOREIGN PATENT DOCUMENTS

| CN | 102594454 A | 7/2012 |
|---|---|---|
| CN | 103647602 A | 3/2014 |
| CN | 105680938 A | 6/2016 |
| CN | 106533556 A | 3/2017 |
| CN | 107888279 A | 4/2018 |

* cited by examiner

AUTONOMOUS FAILURE RECOVERY METHOD AND SYSTEM FOR FIBER-OPTIC COMMUNICATION SYSTEM

TECHNICAL FIELD

The present disclosure relates to the field of fiber-optic communication technologies, and more particularly, relates to an autonomous failure recovery method and system for a fiber-optic communication system.

BACKGROUND

Due to characteristics such as low loss, long transmission distance, high transmission bandwidth, light weight, and low cost, an optical fiber medium has been widely used as a transmission medium in lots of fields including digital distributed radio remote unit (RRU) systems. In currently well-known digital remote systems, a digital signal is converted into an optical signal through a digital optical module, and then the optical signal is transmitted to an opposite end through an optical fiber. The optical signal is converted into a high-speed digital serial signal in an opposite optical module. Through clock recovery and frame header delimitation, serial-parallel conversion and signal restoration are implemented in a digital domain.

In an actual application scenario, an optical path of a fiber-optic communication system may be abnormal due to various reasons, resulting in interruption of entire transmission and malfunction of remote coverage of equipment. In order to ensure normal transmission of a signal, possible failures in the optical path have to be checked and autonomously recovered. However, failure check and autonomous recovery of the optical path in a conventional technology requires human intervention, and the failure check and autonomous recovery is inefficient.

SUMMARY

Based on this, it is necessary to provide an autonomous failure recovery method and system for a fiber-optic communication system with respect to the problem of inefficient failure check and autonomous recovery.

Provided herein is an autonomous failure recovery method for a fiber-optic communication system, including:

acquiring a real-time operation timing of a digital high-speed serial transceiver of the fiber-optic communication system, and comparing the operation timing with a pre-stored reference timing of normal operation of the digital high-speed serial transceiver;

determining a failure of an optical path of the fiber-optic communication system occurs when the operation timing is inconsistent with the reference timing; and transmitting a pre-determined autonomous recovery timing to the digital high-speed serial transceiver, and performing an autonomous failure recovery operation of the fiber-optic communication system in response to the autonomous recovery timing, when the optical path is in a failure state.

Provided herein is an autonomous failure recovery system for a fiber-optic communication system, including:

a comparison module, configured to acquire a real-time operation timing of a digital high-speed serial transceiver of the fiber-optic communication system, and compare the operation timing with a pre-stored reference timing of normal operation of the digital high-speed serial transceiver;

a determination module, configured to determine a failure of an optical path of the fiber-optic communication system occurs when the operation timing is inconsistent with the reference timing; and an autonomous recovery module, configured to transmit, when the optical path is in a failure state, a pre-determined autonomous recovery timing to the digital high-speed serial transceiver, and perform autonomous failure recovery of the fiber-optic communication system in response to the autonomous recovery timing.

Provided herein is a computer-readable storage medium, storing a computer program, the program, when executed by a processor, implementing the following steps:

acquiring a real-time operation timing of a digital high-speed serial transceiver of a fiber-optic communication system, and comparing the operation timing with a pre-stored reference timing of normal operation of the digital high-speed serial transceiver;

determining a failure of an optical path of the fiber-optic communication system occurs when the operation timing is inconsistent with the reference timing; and transmitting, when the optical path is in a failure state, a pre-determined autonomous recovery timing to the digital high-speed serial transceiver, and performing an autonomous failure recovery operation of the fiber-optic communication system in response to the autonomous recovery timing.

Provided herein is a computer device, including a memory, a processor, and a computer program stored in the memory and runnable in the processor, the program, when executed by the processor, implementing the following steps:

acquiring a real-time operation timing of a digital high-speed serial transceiver of a fiber-optic communication system, and comparing the operation timing with a pre-stored reference timing of normal operation of the digital high-speed serial transceiver;

determining a failure of an optical path of the fiber-optic communication system occurs when the operation timing is inconsistent with the reference timing; and transmitting, when the optical path is in a failure state, a pre-determined autonomous recovery timing to the digital high-speed serial transceiver, and performing an autonomous failure recovery operation of the fiber-optic communication system in response to the autonomous recovery timing.

According to the autonomous recovery method and system for the fiber-optic communication system, a real-time operation timing of the digital high-speed serial transceiver of the fiber-optic communication system is acquired, the failure of an optical path of the fiber-optic communication system is determined to have occurred when the operation timing is inconsistent with the reference timing, the positive pulse of the operation timing is transmitted to the digital high-speed serial transceiver, and the autonomous failure recovery operation of the fiber-optic communication system is performed in response to the positive pulse, which can automatically check a failure in the optical path and autonomously recover the optical path, thus improving efficiency of failure check and recovery, reducing manual intervention, and greatly reducing maintenance-related costs while ensuring equipment robustness. In addition, in the present disclosure, state detection for the entire optical path is online real-time detection, so that real-time detection can be performed without affecting normal operation of equipment, ensuring independence of equipment operation and timeliness of device detection.

DETAILED DESCRIPTION OF THE EMBODIMENTS

Technical solutions of the present disclosure are described below with reference to the accompanying drawings.

Figure 1:
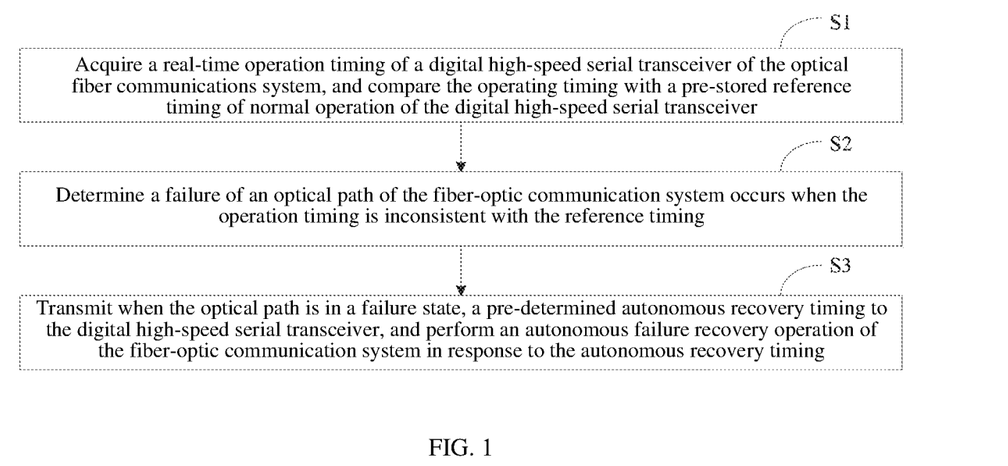
FIG. 1 is a flow diagram illustrating an autonomous failure recovery method for a fiber-optic communication system according to an embodiment.

As shown in FIG. 1, an autonomous failure recovery method for a fiber-optic communication system is provided according to an embodiment of the present disclosure. The method may include the following steps.

In S1, a real-time operation timing of a digital high-speed serial transceiver of the fiber-optic communication system is acquired, and the operation timing is compared with a pre-stored reference timing of normal operation of the digital high-speed serial transceiver.

The fiber-optic communication system may be divided, according to functions of parts of the fiber-optic communication system, into three modules, i.e., an optical module, an optical fiber, and a digital high-speed serial transceiver. The optical module consists of an optoelectronic device, a functional circuit, an optical interface, and so on. The optoelectronic device includes a transmitting part and a receiving part. In short, a function of the optical module is photoelectric conversion. A transmitting end converts an electrical signal into an optical signal. After the optical signal is transmitted through the optical fiber, a receiving end converts the optical signal into an electrical signal. The optical fiber is short for an optical waveguide fiber, which is a fiber made of glass or plastic, and may be used as optical transmission means. A transmission principle thereof is total reflection of light. The digital high-speed serial transceiver is configured to implement a high-speed signal transmitting-receiving process. Performance of the digital high-speed serial transceiver plays an important role in normal operation of an entire optical path of the fiber-optic communication system.

During the normal operation, an operation timing of the digital high-speed serial transceiver is generally fixed. An operation state of the digital high-speed serial transceiver may be detected by detecting the operation timing. The operation timing may be divided into a digital high-speed serial transceiver transmitting reset timing and a digital high-speed serial transceiver receiving reset timing. It is worth mentioning that an existing failure recovery method is generally implemented by manual intervention. Such a method is generally performed in an offline manner, which requires experienced engineering maintenance personnel to arrive at a site and operate according to an indication of a synchronous state. It is common to manually unplug and plug the optical fiber and power on when a failure is found. The method has the following disadvantages: (1) it is necessary to come back and forth to the site for operation, consuming manpower and material resources; and (2) where a problem occurs cannot be effectively determined, and only unplugging and plugging or power-on can be directly and rudely performed, resulting in a long offline time. With the manner according to the present disclosure, autonomous failure recovery can be performed according to the real-time operation timing of the digital high-speed serial transceiver, which is an online autonomous failure recovery method and does not affect normal operation of the fiber-optic communication system.

In S2, a failure of an optical path of the fiber-optic communication system is determined to have occurred when the operation timing is inconsistent with the reference timing.

The digital high-speed serial transceiver transmitting reset timing may include a transmitting physical medium attachment reset (TXPMARESET) timing and a transmitting physical coding sub-layer reset (TXPCSRESET) timing. "TX" denotes transmitting, PMA denotes physical medium attachment, RESET denotes reset, and PCS denotes physical coding sub-layer. A function of the two timings is to effectively ensure that a state of a circuit meets requirements of optical fiber transmission before normal operation is started. A reference signal transmitting timing of normal operation of the digital high-speed serial transceiver is generally fixed. Therefore, when a signal transmitting timing is inconsistent with the reference signal transmitting timing of normal operation of the digital high-speed serial transceiver, a failure of an optical path of the fiber-optic communication system may be determined to have occurred.

The digital high-speed serial transceiver receiving reset timing may include a receiving physical medium attachment reset (RXPMARESET) timing, a receiving low-power mode reset (RXLPMREST) timing, a receiving physical coding sub-layer reset (RXPCSRESET) timing, and a receiving buffer reset (RXBUFRESET) timing.

In S3, when the optical path is in a failure state, a pre-determined autonomous recovery timing is transmitted to the digital high-speed serial transceiver, and an autonomous failure recovery operation of the fiber-optic communication system is performed in response to the autonomous recovery timing.

Corresponding to the specific digital high-speed serial transceiver transmitting reset timing, in this step, when the digital high-speed serial transceiver transmitting reset timing performs autonomous recovery, a phase-locked loop reset timing may be transmitted to the digital high-speed serial transceiver, where the digital high-speed serial transceiver returns a phase-locked loop locking timing in response to a positive pulse of the phase-locked loop reset timing; the transmitting physical medium attachment reset timing is transmitted to the digital high-speed serial transceiver if a negative pulse of the phase-locked loop locking timing is detected, where after detecting a positive pulse of the transmitting physical medium attachment reset timing, the digital high-speed serial transceiver executes a transmitting physical medium attachment reset timing autonomous recovery process, and returns a high level of a transmitting user ready timing after the transmitting physical medium attachment reset timing autonomous recovery process ends; and the transmitting physical coding sub-layer reset timing is transmitted to the digital high-speed serial transceiver in response to the high level of the transmitting user ready timing, where after detecting a positive pulse of the transmitting physical coding sub-layer reset timing, the digital high-speed serial transceiver executes a transmitting physical coding sub-layer reset timing autonomous recovery process, and returns a high level of a transmitting reset-completion timing after the transmitting physical coding sub-layer reset timing autonomous recovery process ends. A schematic diagram illustrating an autonomous failure recovery operation flow and a diagram illustrating timing control at a transmitting end of a digital high-speed serial transceiver according to an embodiment are shown in FIG. 2 and FIG. 3 respectively.

Figure 2:
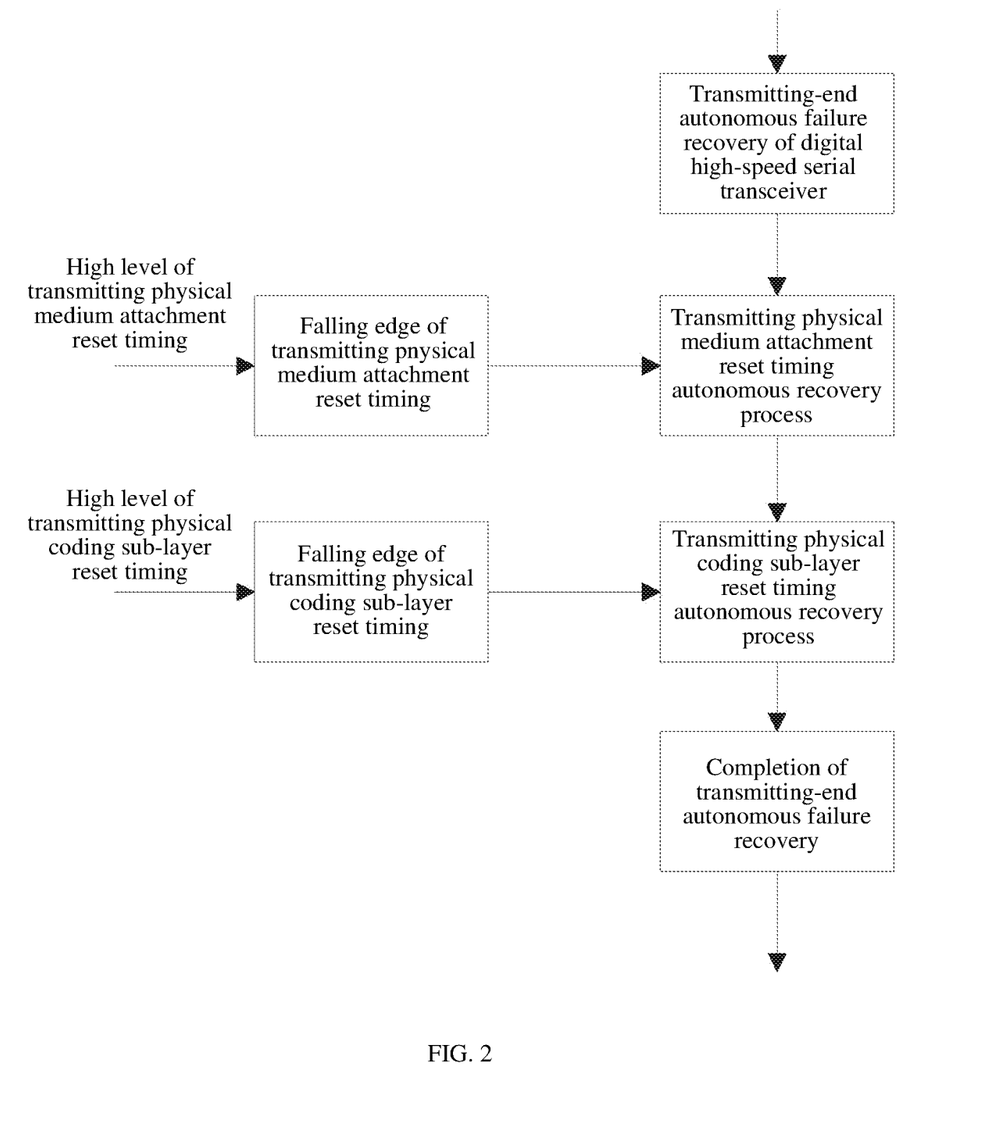
FIG. 2 is a schematic diagram illustrating an autonomous failure recovery operation flow at a transmitting end of a digital high-speed serial transceiver according to an embodiment.
Figure 3:
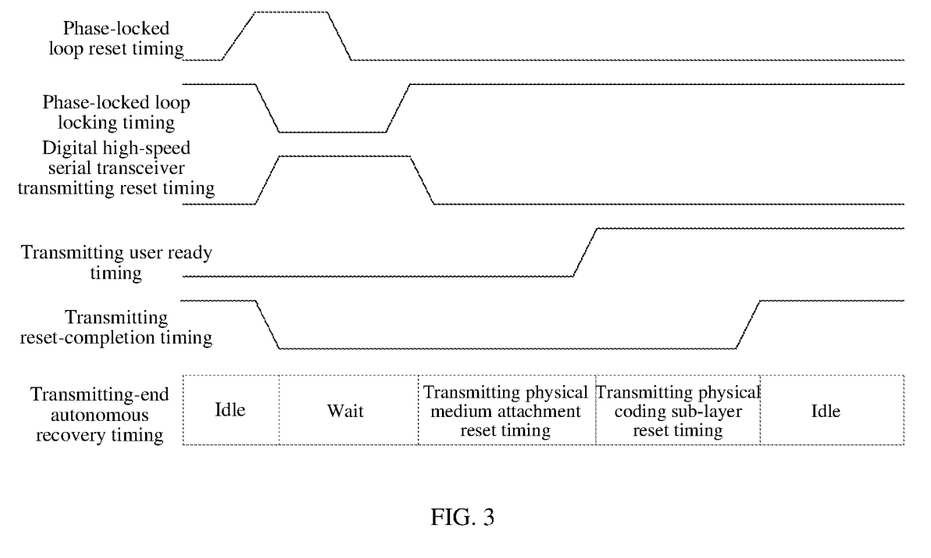
FIG. 3 is a schematic diagram illustrating an autonomous failure recovery operation timing at a transmitting end of a digital high-speed serial transceiver according to an embodiment.

As shown in FIG. 2, after the positive pulse of the transmitting physical medium attachment reset timing is received, the transmitting physical medium attachment reset timing autonomous recovery process is started. Similarly, after a positive pulse of a transmitting physical coding sub-layer reset timing is received, a transmitting physical coding sub-layer reset timing autonomous recovery process is started. A specific autonomous recovery timing is as shown in FIG. 3. In FIG. 3, the digital high-speed serial transceiver transmitting reset timing may be a transmitting physical medium attachment reset timing or a transmitting physical coding sub-layer reset timing. First, the positive pulse of the transmitting physical medium attachment reset timing may be transmitted to the digital high-speed serial transceiver. Then, after the transmitting physical medium attachment reset timing autonomous recovery process is completed, the positive pulse of the transmitting physical medium attachment reset timing is again transmitted to the digital high-speed serial transceiver, so as to execute the transmitting physical medium attachment reset timing autonomous recovery process. As shown in FIG. 3, the transmitting user ready timing being at a low level indicates that the transmitting physical medium attachment reset timing autonomous recovery process is being executed. After the transmitting user ready timing is switched to a high level, indicating that the transmitting physical medium attachment reset timing autonomous recovery process is completed, the transmitting physical coding sub-layer reset timing autonomous recovery process is started.

Corresponding to the specific digital high-speed serial transceiver receiving reset timing, in this step, when the digital high-speed serial transceiver receiving reset timing performs autonomous recovery, a phase-locked loop reset timing may be transmitted to the digital high-speed serial transceiver, where the digital high-speed serial transceiver returns a phase-locked loop locking timing in response to a positive pulse of the phase-locked loop reset timing; the receiving physical medium attachment reset timing is transmitted to the digital high-speed serial transceiver if a negative pulse of the phase-locked loop locking timing is detected, where after detecting a positive pulse of the receiving physical medium attachment reset timing, the digital high-speed serial transceiver executes a receiving physical medium attachment reset timing autonomous recovery process, and returns a high level of a receiving physical medium attachment reset-completion timing after the receiving physical medium attachment reset timing autonomous recovery process ends; the receiving low-power mode reset timing is transmitted to the digital high-speed serial transceiver in response to the high level of the receiving physical medium attachment reset-completion timing, where after detecting a positive pulse of the receiving low-power mode reset timing, the digital high-speed serial transceiver executes a receiving low-power mode reset timing autonomous recovery process, and returns a high level of a receiving user ready timing after the receiving low-power mode reset timing autonomous recovery process ends; and the receiving physical coding sub-layer reset timing is transmitted to the digital high-speed serial transceiver in response to the high level of the receiving user ready timing, where after detecting a positive pulse of the receiving physical coding sub-layer reset timing, the digital high-speed serial transceiver executes a receiving physical coding sub-layer reset timing autonomous recovery process, and returns a high level of a receiving reset-completion timing after the receiving physical coding sub-layer reset timing autonomous recovery process ends. A schematic diagram illustrating an autonomous failure recovery operation flow and a diagram illustrating timing control at a receiving end of a digital high-speed serial transceiver according to an embodiment are shown in FIG. 4 and FIG. 5 respectively.

Figure 4:
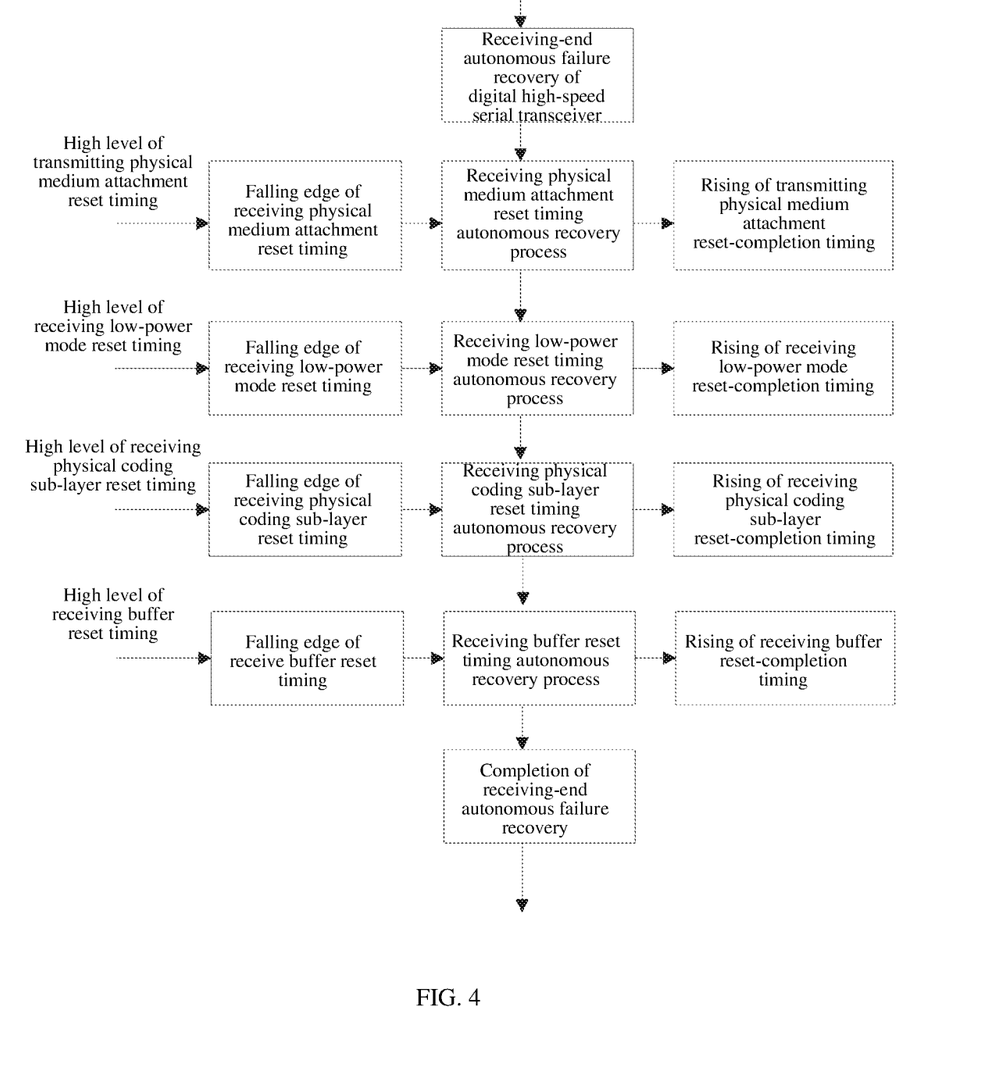
FIG. 4 is a schematic diagram illustrating an autonomous failure recovery operation flow at a receiving end of a digital high-speed serial transceiver according to an embodiment.
Figure 5:
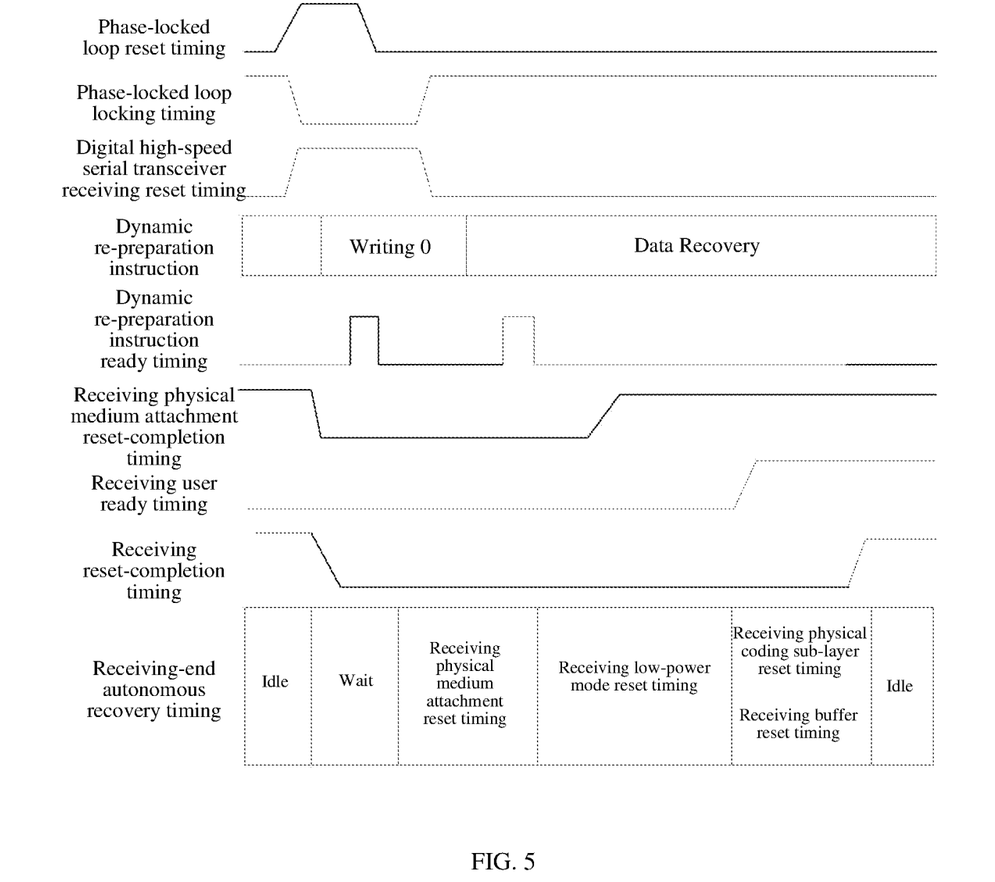
FIG. 5 is a schematic diagram illustrating an autonomous failure recovery operation timing at a receiving end of a digital high-speed serial transceiver according to an embodiment.

As shown in FIG. 4, after the positive pulse of the receiving physical medium attachment reset timing is received, the receiving physical medium attachment reset timing autonomous recovery process is started. Similarly, after a positive pulse of a receiving physical coding sub-layer reset timing is received, a receiving physical coding sub-layer reset timing autonomous recovery process is started. Similarly, after a positive pulse of a receiving low-power mode reset timing is received, a receiving low-power mode reset timing autonomous recovery process is started. A specific autonomous recovery timing is as shown in FIG. 5. In FIG. 5, the digital high-speed serial transceiver receiving reset timing may be a receiving physical medium attachment reset timing, a receiving physical coding sub-layer reset timing, or a receiving low-power mode reset timing. First, the positive pulse of the receiving physical medium attachment reset timing may be transmitted to the digital high-speed serial transceiver. Next, after the receiving physical medium attachment reset timing autonomous recovery process is completed, the positive pulse of the receiving low-power mode reset timing is transmitted to the digital high-speed serial transceiver, so as to execute the receiving low-power mode reset timing autonomous recovery process. Then, the positive pulse of the receiving physical medium attachment reset timing is again transmitted to the digital high-speed serial transceiver, so as to execute the receiving physical medium attachment reset timing autonomous recovery process. As shown in FIG. 5, the receiving physical medium attachment reset-completion timing and the receiving user ready timing being both at a low level indicates that the receiving physical medium attachment reset timing autonomous recovery process is being executed. The receiving physical medium attachment reset-completion timing being at a high level and the receiving user ready timing being at a low level indicates that the receiving low-power mode reset timing autonomous recovery process is being executed. The receiving physical medium attachment reset-completion timing and the receiving user ready timing being both at a high level indicates that the receiving low-power mode reset timing autonomous recovery process is completed and the receiving physical coding sub-layer reset timing autonomous recovery process is started. When the receiving reset-completion timing is switched to a high level, it indicates that the receiving physical coding sub-layer reset timing autonomous recovery process is completed.

In an embodiment, the digital high-speed serial transceiver receiving reset timing further includes a receiving buffer reset timing. During autonomous recovery, the receiving buffer reset timing may be transmitted to the digital high-speed serial transceiver in response to a high level of the receiving user ready timing. After detecting a positive pulse of the receiving buffer reset timing, the digital high-speed serial transceiver executes a receiving buffer reset timing autonomous recovery process, and returns a high level of a receiving reset-completion timing after the receiving buffer reset timing autonomous recovery process ends.

In an embodiment, after the positive pulse of the receiving physical medium attachment reset timing is transmitted to the digital high-speed serial transceiver, a dynamic re-preparation (DRP) instruction and a dynamic re-preparation instruction ready (DRPRDY) timing may also be transmitted to the digital high-speed serial transceiver. After detecting a first positive pulse of the dynamic re-preparation instruction ready timing, the digital high-speed serial transceiver performs a writing-0 operation in response to the dynamic re-preparation instruction. After detecting a second positive pulse of the dynamic re-preparation instruction, the digital high-speed serial transceiver performs a data recovery operation in response to the dynamic re-preparation instruction.

Software autonomous recovery of the digital high-speed serial transceiver can be implemented by performing the above timing operations.

In a further embodiment, parameters of the digital high-speed serial transceiver, such as an 8-B/10-B coding and decoding value, a transmitting and receiving data buffer tag value, and/or a serial-parallel converted K-code interval, may also be detected. The detected 8-B/10-B coding and decoding value may be compared with a comparison table of pre-stored 8-B/10-B coding and decoding values. If the detected 8-B/10-B coding and decoding value is in the comparison table, it may be considered that the fiber-optic communication system normally operates. Otherwise, if the detected 8-B/10-B coding and decoding value is not in the comparison table, it may be determined that the fiber-optic communication system fails and a receiving-end or transmitting-end physical coding sub-layer reset operation is performed. A function of the transmitting and receiving data buffer tag value is to represent whether a buffer of the digital high-speed serial transceiver is full. If the transmitting and receiving data buffer tag value is detected, it indicates that the buffer is full and the receiving-end or transmitting-end physical coding sub-layer reset operation may be performed. Otherwise, if the transmitting and receiving data buffer tag value is not detected, it indicates that the buffer is not full. Besides, the serial-parallel converted K-code interval may be compared with a pre-stored reference value of the serial-parallel converted K-code interval. If they are different, it is determined that the fiber-optic communication system fails and that an error occurred in an entire receiving channel, and a reset and autonomous recovery operation is directly performed on the receiving channel of the high-speed transceiver.

In addition to the autonomous recovery for the timing, autonomous recovery for hardware may also be implemented in the present disclosure. Specifically, a real-time operating state parameter of an optical module may be sampled to acquire a sample parameter, and level detection is performed on the sample parameter to acquire a level detection value. The level detection value is compared with a level reference value of normal operation of an optical path. If the level detection value is inconsistent with the level reference value, a clock of the fiber-optic communication system is reconfigured or a fiber-optic communication link is powered off and restarted. The real-time operating state parameter of the optical module may include an optical transmission information state parameter, an optical loss information state parameter, and an optical module presence information state parameter. The optical transmission information state parameter being at a high level indicates a transmission failure in the current optical path. The optical loss information state parameter being at a high level indicates an optical signal transmission failure in the current optical path. The optical module presence information state parameter being at a high level indicates that the optical module cannot be normally connected to equipment. When at least one of the optical transmission information state parameter, the optical loss information state parameter, and the optical module presence information state parameter is at a high level, the optical path may be powered off and restarted. In this way, hardware failures of the fiber-optic communication system can be effectively self-healed.

According to the present disclosure, it can be acquired whether there is a physical damage in a current physical optical fiber link to determine an autonomous recovery range, with a purpose of determining whether a problem occurs in hardware or software. If the problem occurs in the hardware, hardware autonomous recovery is performed before software autonomous recovery. If it is determined there is no problem with the hardware, the software autonomous recovery is directly performed.

Figure 6:
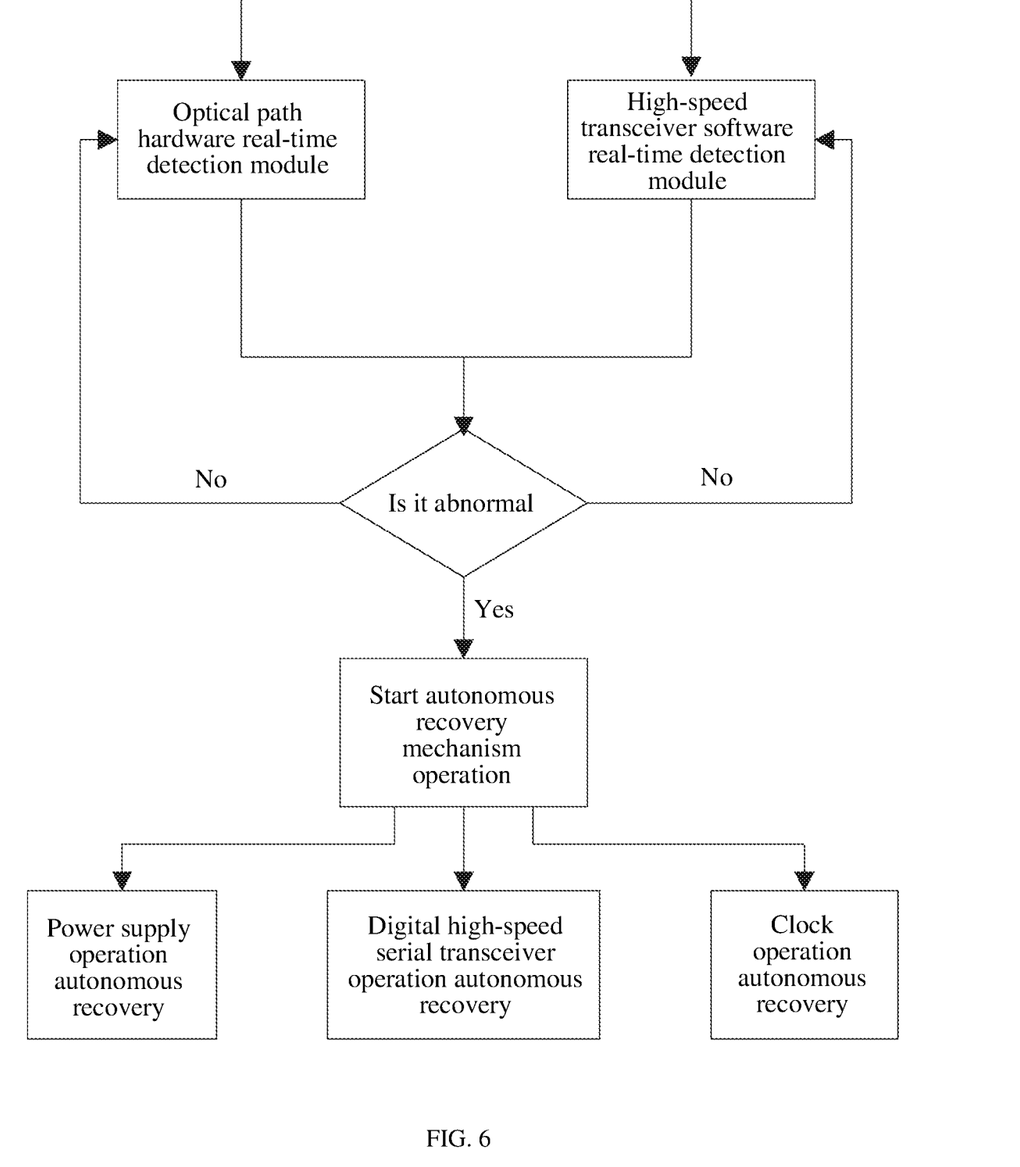
FIG. 6 is a flow diagram illustrating overall detection and autonomous recovery according to an embodiment.

In addition, autonomous recovery for a clock may also be implemented in the present disclosure. An overall detection and autonomous recovery flow is as shown in FIG. 6.

If no abnormality is found, the detection may be continued. When it is found that the optical path is abnormal, depending on different abnormal situations, corresponding operations can be automatically performed to expect the system to return to a normal operation state after completion of the corresponding operations.

Figure 7:
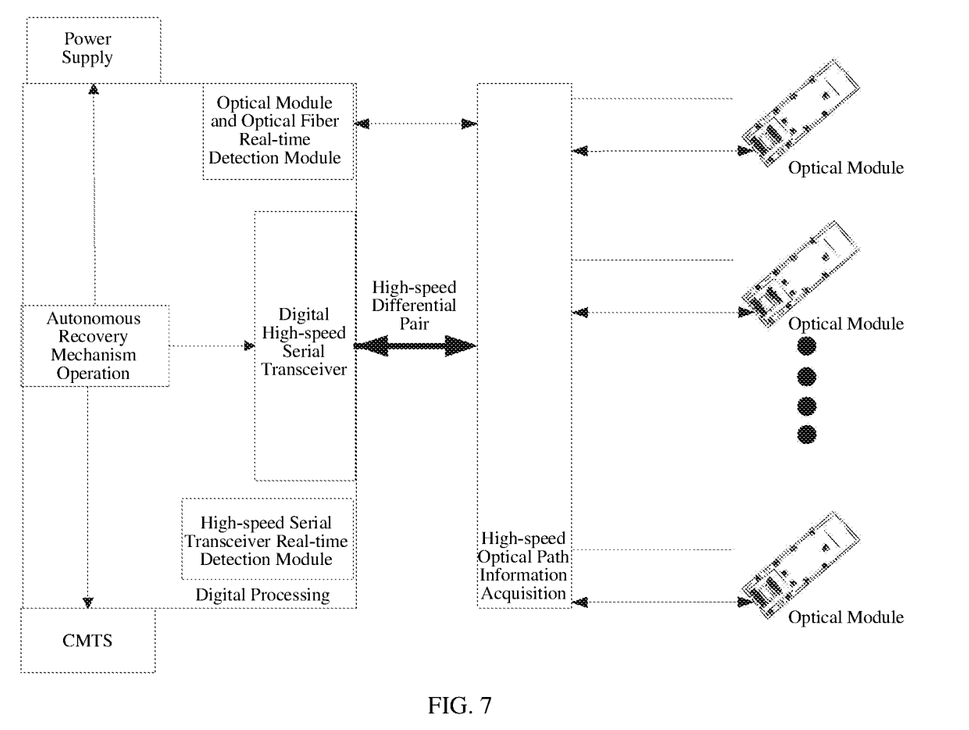
FIG. 7 is a functional module diagram illustrating an autonomous failure recovery device for a fiber-optic communication system according to an embodiment.

In an embodiment, autonomous failure recovery of the fiber-optic communication system may be performed by means of functional modules shown in FIG. 7. The functional modules may include a high-speed optical path information acquisition module, an optical module and optical fiber real-time detection module, a high-speed serial transceiver real-time detection module, and an autonomous recovery mechanism operation module. The high-speed optical path information acquisition module may acquire an operation state parameter of an optical module and compare the operation state parameter with a pre-stored reference value. The optical module and optical fiber real-time detection module may acquire a real-time operation timing of the digital high-speed serial transceiver and compare the real-time operation timing with a pre-stored reference timing. Comparison results from the optical module and optical fiber real-time detection module and the high-speed serial transceiver real-time detection module may be reported to the autonomous recovery mechanism operation module in real time. The autonomous recovery mechanism operation module may execute a corresponding autonomous recovery process according to the comparison results.

According to the present disclosure, real-time online detection can be performed on an entire optical path in a fiber-optic communication system, software and hardware problems are classified according to detected states, and an autonomous recovery method is correspondingly started and implemented, which not only can online monitor and remotely report a state of the optical path, but also can automatically start an autonomous recovery operation for a detected abnormal state of the optical path, thus greatly improving transmission stability and automatic recovery capability of the optical path.

Compared with the prior art, the present disclosure has the following advantages and beneficial effects.

(1) In the present disclosure, a state of the entire optical path is real-time detected online, so that real-time detection can be performed without affecting normal operation of the equipment, thus ensuring operation independence and detection timeliness of the equipment.

(2) In the present disclosure, not only can the optical path be detected, but also different forms of autonomous recovery operations can be performed according to different results obtained from the detection, which improves equipment self-management capability, reduces manual intervention, and greatly reduces maintenance-related costs while ensuring equipment robustness.

Figure 8:
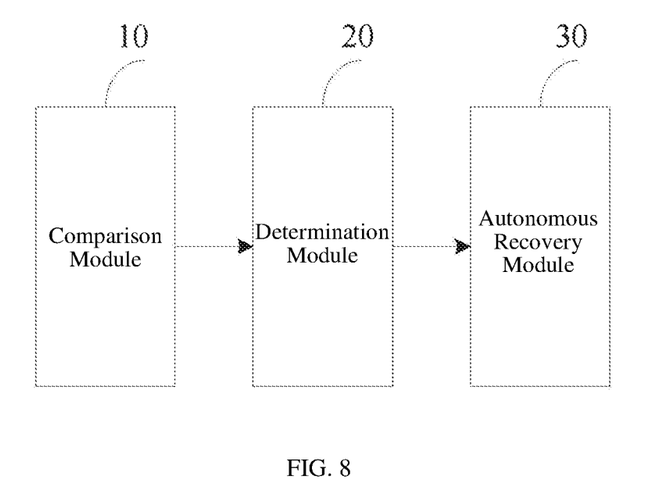
FIG. 8 is a schematic structural diagram illustrating an autonomous failure recovery system for a fiber-optic communication system according to an embodiment.

As shown in FIG. 8, an autonomous failure recovery system for a fiber-optic communication system is further provided in the present disclosure. The autonomous failure recovery system may include the following modules.

A comparison module 10 is configured to acquire a real-time operation timing of a digital high-speed serial transceiver of the fiber-optic communication system, and compare the operation timing with a pre-stored reference timing of normal operation of the digital high-speed serial transceiver.

The fiber-optic communication system may be divided, according to functions of parts of the fiber-optic communication system, into three modules, i.e., an optical module, an optical fiber, and a digital high-speed serial transceiver. The optical module consists of an optoelectronic device, a functional circuit, an optical interface, and so on. The optoelectronic device includes a transmitting part and a receiving part. In short, a function of the optical module is photoelectric conversion. A transmitting end converts an electrical signal into an optical signal. After the optical signal is transmitted through the optical fiber, a receiving end converts the optical signal into an electrical signal. The optical fiber is short for an optical waveguide fiber, which is a fiber made of glass or plastic, and may be used as optical transmission means. A transmission principle thereof is total reflection of light. The digital high-speed serial transceiver is configured to implement a high-speed signal transmitting-receiving process. Performance of the digital high-speed serial transceiver plays an important role in normal operation of an entire optical path of the fiber-optic communication system.

During the normal operation, an operation timing of the digital high-speed serial transceiver is generally fixed. An operation state of the digital high-speed serial transceiver may be detected by detecting the operation timing. The operation timing may be divided into a digital high-speed serial transceiver transmitting reset timing and a digital high-speed serial transceiver receiving reset timing. It is worth mentioning that an existing failure recovery method is generally implemented by manual intervention. Such a method is generally performed in an offline manner, which requires experienced engineering maintenance personnel to arrive at a site and operate according to an indication of a synchronous state. It is common to manually plug and unplug the optical fiber and power on when a failure is found. The method has the following disadvantages: (1) it is necessary to come back and forth to the site for operation, consuming manpower and material resources; and (2) where a problem occurs cannot be effectively determined, and only plugging and unplugging or power-on can be directly and rudely performed, resulting in a long offline time. With the manner according to the present disclosure, autonomous failure recovery can be performed according to the real-time operation timing of the digital high-speed serial transceiver, which is an online autonomous failure recovery method and does not affect normal operation of the fiber-optic communication system.

A determination module 20 is configured to determine a failure of an optical path of the fiber-optic communication system occurs when the operation timing is inconsistent with the reference timing.

The digital high-speed serial transceiver transmitting reset timing may include a transmitting physical medium attachment reset (TXPMARESET) timing and a transmitting physical coding sub-layer reset (TXPCSRESET) timing. "TX" denotes transmit, PMA denotes physical medium attachment, RESET denotes reset, and PCS denotes physical coding sub-layer. A function of the two timings is to effectively ensure that a state of a circuit meets requirements of optical fiber transmission before normal operation is started. A reference signal transmitting timing of normal operation of the digital high-speed serial transceiver is generally fixed. Therefore, when a signal transmitting timing is inconsistent with the reference signal transmitting timing of normal operation of the digital high-speed serial transceiver, a failure of an optical path of the fiber-optic communication system may be determined.

The digital high-speed serial transceiver receiving reset timing may include a receiving physical medium attachment reset (RXPMARESET) timing, a receiving low-power mode reset (RXLPMRESET) timing, a receiving physical coding sub-layer reset (RXPCSRESET) timing, and a receiving buffer reset (RXBUFRESET) timing.

An autonomous recovery module 30 is configured to transmit, when the optical path is in a failure state, a pre-determined autonomous recovery timing to the digital high-speed serial transceiver, and perform an autonomous failure recovery operation of the fiber-optic communication system in response to the autonomous recovery timing.

Corresponding to the specific digital high-speed serial transceiver transmitting reset timing, in the step, when the digital high-speed serial transceiver transmitting reset timing performs autonomous recovery, a phase-locked loop reset timing may be transmitted to the digital high-speed serial transceiver, where the digital high-speed serial transceiver returns a phase-locked loop locking timing in response to a positive pulse of the phase-locked loop reset timing; the receiving physical medium attachment reset timing is transmitted to the digital high-speed serial transceiver if a negative pulse of the phase-locked loop locking timing is detected, where after detecting a positive pulse of the transmitting physical medium attachment reset timing, the digital high-speed serial transceiver executes a transmitting physical medium attachment reset timing autonomous recovery process, and returns a high level of a transmitting user ready timing after the transmitting physical medium attachment reset timing autonomous recovery process ends; and the transmitting physical coding sub-layer reset timing is transmitted to the digital high-speed serial transceiver in response to the high level of the transmitting user ready timing, where after detecting a positive pulse of the transmitting physical coding sub-layer reset timing, the digital high-speed serial transceiver executes a transmitting physical coding sub-layer reset timing autonomous recovery process, and returns a high level of a transmitting reset-completion timing after the transmitting physical coding sub-layer reset timing autonomous recovery process ends. A schematic diagram illustrating an autonomous failure recovery operation flow and a diagram illustrating timing control at a transmitting end of a digital high-speed serial transceiver according to an embodiment are shown in FIG. 2 and FIG. 3 respectively.

As shown in FIG. 2, after the positive pulse of the transmitting physical medium attachment reset timing is received, the transmitting physical medium attachment reset timing autonomous recovery process is started. Similarly, after a positive pulse of a transmitting physical coding sub-layer reset timing is received, a transmitting physical coding sub-layer reset timing autonomous recovery process is started. A specific autonomous recovery timing is as shown in FIG. 3. In FIG. 3, the digital high-speed serial transceiver transmitting reset timing may be a transmitting physical medium attachment reset timing or a transmitting physical coding sub-layer reset timing. First, the positive pulse of the transmitting physical medium attachment reset timing may be transmitted to the digital high-speed serial transceiver. Then, after the transmitting physical medium attachment reset timing autonomous recovery process is completed, the positive pulse of the transmitting physical medium attachment reset timing is again transmitted to the digital high-speed serial transceiver, so as to execute the transmitting physical medium attachment reset timing autonomous recovery process. As shown in FIG. 3, the transmitting user ready timing being at a low level indicates that the transmitting physical medium attachment reset timing autonomous recovery process is being executed. After the transmitting user ready timing is switched to a high level, indicating that the transmitting physical medium attachment reset timing autonomous recovery process is completed, the transmitting physical coding sub-layer reset timing autonomous recovery process is started.

Corresponding to the specific digital high-speed serial transceiver receiving reset timing, in the step, when the digital high-speed serial transceiver receiving reset timing performs autonomous recovery, a phase-locked loop reset timing may be transmitted to the digital high-speed serial transceiver, where the digital high-speed serial transceiver returns a phase-locked loop locking timing in response to a positive pulse of the phase-locked loop reset timing; the receiving physical medium attachment reset timing is transmitted to the digital high-speed serial transceiver if a negative pulse of the phase-locked loop locking timing is detected, where after detecting a positive pulse of the receiving physical medium attachment reset timing, the digital high-speed serial transceiver executes a receiving physical medium attachment reset timing autonomous recovery process, and returns a high level of a receiving physical medium attachment reset-completion timing after the receiving physical medium attachment reset timing autonomous recovery process ends; the receiving low-power mode reset timing is transmitted to the digital high-speed serial transceiver in response to the high level of the receiving physical medium attachment reset-completion timing, where after detecting a positive pulse of the receiving low-power mode reset timing, the digital high-speed serial transceiver executes a receiving low-power mode reset timing autonomous recovery process, and returns a high level of a receiving user ready timing after the receiving low-power mode reset timing autonomous recovery process ends; and the receiving physical coding sub-layer reset timing is transmitted to the digital high-speed serial transceiver in response to the high level of the receiving user ready timing, where after detecting a positive pulse of the receiving physical coding sub-layer reset timing, the digital high-speed serial transceiver executes a receiving physical coding sub-layer reset timing autonomous recovery process, and returns a high level of a receiving reset-completion timing after the receiving physical coding sub-layer reset timing autonomous recovery process ends. A schematic diagram illustrating an autonomous failure recovery operation flow and a diagram illustrating timing control at a receiving end of a digital high-speed serial transceiver according to an embodiment are shown in FIG. 4 and FIG. 5 respectively.

As shown in FIG. 4, after the positive pulse of the receiving physical medium attachment reset timing is received, the receiving physical medium attachment reset timing autonomous recovery process is started. Similarly, after a positive pulse of a receiving physical coding sub-layer reset timing is received, a receiving physical coding sub-layer reset timing autonomous recovery process is started. Similarly, after a positive pulse of a receiving low-power mode reset timing is received, a receiving low-power mode reset timing autonomous recovery process is started. A specific autonomous recovery timing is as shown in FIG. 5. In FIG. 5, the digital high-speed serial transceiver receiving reset timing may be a receiving physical medium attachment reset timing, a receiving physical coding sub-layer reset timing, or a receiving low-power mode reset timing. First, the positive pulse of the receiving physical medium attachment reset timing may be transmitted to the digital high-speed serial transceiver. Next, after the receiving physical medium attachment reset timing autonomous recovery process is completed, the positive pulse of the receiving low-power mode reset timing is transmitted to the digital high-speed serial transceiver, so as to execute the receiving low-power mode reset timing autonomous recovery process. Then, the positive pulse of the receiving physical medium attachment reset timing is again transmitted to the digital high-speed serial transceiver, so as to execute the receiving physical medium attachment reset timing autonomous recovery process. As shown in FIG. 5, the receiving physical medium attachment reset-completion timing and the receiving user ready timing being both at a low level indicates that the receiving physical medium attachment reset timing autonomous recovery process is being executed. The receiving physical medium attachment reset-completion timing being at a high level and the receiving user ready timing being at a low level indicates that the receiving low-power mode reset timing autonomous recovery process is being executed. The receiving physical medium attachment reset-completion timing and the receiving user ready timing being both at a high level indicates that the receiving low-power mode reset timing autonomous recovery process is completed and the receiving physical coding sub-layer reset timing autonomous recovery process is started. When the receiving reset-completion timing is switched to a high level, it indicates that the receiving physical coding sub-layer reset timing autonomous recovery process is completed.

In an embodiment, the digital high-speed serial transceiver receiving reset timing further includes a receiving buffer reset timing. During autonomous recovery, the receiving buffer reset timing may be transmitted to the digital high-speed serial transceiver in response to a high level of the receiving user ready timing. After detecting a positive pulse of the receiving buffer reset timing, the digital high-speed serial transceiver executes a receiving buffer reset timing autonomous recovery process, and returns a high level of a receiving reset-completion timing after the receiving buffer reset timing autonomous recovery process ends.

In an embodiment, after the positive pulse of the receiving physical medium attachment reset timing is transmitted to the digital high-speed serial transceiver, a dynamic re-preparation instruction and a dynamic re-preparation instruction ready timing may also be transmitted to the digital high-speed serial transceiver. After detecting a first positive pulse of the dynamic re-preparation instruction ready timing, the digital high-speed serial transceiver performs a writing-0 operation in response to the dynamic re-preparation instruction. After detecting a second positive pulse of the dynamic re-preparation instruction, the digital high-speed serial transceiver performs a data recovery operation in response to the dynamic re-preparation instruction.

Software autonomous recovery of the digital high-speed serial transceiver can be implemented by performing the above timing operations.

In a further embodiment, parameters of the digital high-speed serial transceiver, such as an 8-B/10-B coding and decoding value, a transmitting and receiving data buffer tag value, and/or a serial-parallel converted K-code interval, may also be detected. The detected 8-B/10-B coding and decoding value may be compared with a comparison table of pre-stored 8-B/10-B coding and decoding values. If the detected 8-B/10-B coding and decoding value is in the comparison table, it may be considered that the fiber-optic communication system normally operates. Otherwise, if the detected 8-B/10-B coding and decoding value is not in the comparison table, it may be determined that the fiber-optic communication system fails and a receiving-end or transmitting-end physical coding sub-layer reset operation is performed. A function of the transmitting and receiving data buffer tag value is to represent whether a buffer of the digital high-speed serial transceiver is full. If the transmitting and receiving data buffer tag value is detected, it indicates that the buffer is full and the receiving-end or transmitting-end physical coding sub-layer reset operation may be performed. Otherwise, if the transmitting and receiving data buffer tag value is not detected, it indicates that the buffer is not full. Besides, the serial-parallel converted K-code interval may be compared with a pre-stored reference value of the serial-parallel converted K-code interval. If they are different, it is determined that the fiber-optic communication system fails and that an error occurred in an entire receiving channel, and a reset and autonomous recovery operation is directly performed on the receiving channel of the high-speed transceiver.

In addition to the autonomous recovery for the timing, autonomous recovery for hardware may also be implemented in the present disclosure. Specifically, a real-time operating state parameter of an optical module may be sampled to acquire a sample parameter, and level detection is performed on the sample parameter to acquire a level detection value. The level detection value is compared with a level reference value of normal operation of an optical path. If the level detection value is inconsistent with the level reference value, a clock of the fiber-optic communication system is reconfigured or an fiber-optic communication link is powered off and restarted. The real-time operating state parameter of the optical module may include an optical transmission information state parameter, an optical loss information state parameter, and an optical module presence information state parameter. The optical transmission information state parameter being at a high level indicates a transmission failure in the current optical path. The optical loss information state parameter being at a high level indicates an optical signal transmission failure in the current optical path. The optical module presence information state parameter being at a high level indicates that the optical module cannot be normally connected to equipment. When at least one of the optical transmission information state parameter, the optical loss information state parameter, and the optical module presence information state parameter is at a high level, the optical path may be powered off and restarted. In this way, hardware failures of the fiber-optic communication system can be effectively self-healed.

According to the present disclosure, it can be acquired whether there is a physical damage in a current physical optical fiber link to determine an autonomous recovery range, with a purpose of determining whether a problem occurs in hardware or software. If the problem occurs in the hardware, hardware autonomous recovery is performed before software autonomous recovery. If it is determined there is no problem with the hardware, the software autonomous recovery is directly performed.

In addition, autonomous recovery for a clock may also be implemented in the present disclosure. An overall detection and autonomous recovery flow is as shown in FIG. 6.

If no abnormality is found, the detection may be continued. When it is found that the optical path is abnormal, depending on different abnormal situations, corresponding operations can be automatically performed to expect the system to return to a normal operation state after completion of the corresponding operations.

In an embodiment, autonomous failure recovery of the fiber-optic communication system may be performed by means of functional modules shown in FIG. 7. The functional modules may include: a high-speed optical path information acquisition module, an optical module and optical fiber real-time detection module, a high-speed serial transceiver real-time detection module, and an autonomous recovery mechanism operation module. The high-speed optical path information acquisition module may acquire an operation state parameter of an optical module and compare the operation state parameter with a pre-stored reference value. The optical module and optical fiber real-time detection module may acquire a real-time operation timing of the digital high-speed serial transceiver and compare the real-time operation timing with a pre-stored reference timing. Comparison results from the optical module and optical fiber real-time detection module and the high-speed serial transceiver real-time detection module may be reported to the autonomous recovery mechanism operation module in real time. The autonomous recovery mechanism operation module may execute a corresponding autonomous recovery process according to the comparison results.

According to the present disclosure, real-time online detection can be performed on an entire optical path in a fiber-optic communication system, software and hardware problems are classified according to detected states, and an autonomous recovery method is correspondingly started and implemented, which not only can online monitor and remotely report a state of the optical path, but also can automatically start an autonomous recovery operation for a detected abnormal state of the optical path, thus greatly improving transmission stability and automatic recovery capability of the optical path.

Compared with the prior art, the present disclosure has the following advantages and beneficial effects.

(1) In the present disclosure, a state of the entire optical path is real-time detected online, so that real-time detection can be performed without affecting normal operation of the equipment, thus ensuring operation independence and detection timeliness of the equipment.

(2) In the present disclosure, not only can the optical path be detected, but also different forms of autonomous recovery operations can be performed according to different results obtained from the detection, which improves equipment self-management capability, reduces manual intervention, and greatly reduces maintenance-related costs while ensuring equipment robustness.

In an embodiment, a computer-readable storage medium storing a computer program is further provided in the present disclosure. When executed by a processor, the program implements the following steps:

acquiring a real-time operation timing of a digital high-speed serial transceiver of the fiber-optic communication system, and comparing the operation timing with a pre-stored reference timing of normal operation of the digital high-speed serial transceiver;

determining a failure of an optical path of the fiber-optic communication system occurs when the operation timing is inconsistent with the reference timing; and transmitting, when the optical path is in a failure state, a positive pulse of the operation timing to the digital high-speed serial transceiver, and performing an autonomous failure recovery operation of the fiber-optic communication system in response to the positive pulse.

Other embodiments of the steps implemented by the processor are the same as the embodiments of the autonomous failure recovery method for a fiber-optic communication system in the present disclosure, and descriptions thereof are omitted herein.

In an embodiment, a computer device is further provided in the present invention. The computer device includes a memory, a processor, and a computer program stored in the memory and runnable in the processor. When executed by the processor, the program implements the following steps:

acquiring a real-time operation timing of a digital high-speed serial transceiver of the fiber-optic communication system, and comparing the operation timing with a pre-stored reference timing of normal operation of the digital high-speed serial transceiver;

determining a failure of an optical path of the fiber-optic communication system occurs when the operation timing is inconsistent with the reference timing; and transmitting, when the optical path is in a failure state, a positive pulse of the operation timing to the digital high-speed serial transceiver, and performing an autonomous failure recovery operation of the fiber-optic communication system in response to the positive pulse.

Other embodiments of the steps implemented by the computer device are the same as the embodiments of the autonomous failure recovery method for a fiber-optic communication system in the present disclosure, and descriptions thereof are omitted herein.

The autonomous failure recovery system for a fiber-optic communication system in the present disclosure one-to-one corresponds to the autonomous failure recovery method for a fiber-optic communication system in the present disclosure. It is hereby declared that technical features and beneficial effects elaborated in the embodiments of the autonomous failure recovery method for a fiber-optic communication system are all applicable to the embodiments of the autonomous failure recovery system for a fiber-optic communication system.

The logic and/or step described in other manners herein or shown in the flow chart, for example, a particular sequence table of executable instructions for realizing the logical function, may be specifically achieved in any computer readable medium to be used by the instruction execution system, device or equipment (such as the system based on computers, the system comprising processors or other systems capable of obtaining the instruction from the instruction execution system, device and equipment and executing the instruction), or to be used in combination with the instruction execution system, device and equipment. As to the specification, "the computer readable medium" may be any device adaptive for including, storing, communicating, propagating or transferring programs to be used by or in combination with the instruction execution system, device or equipment.

More specific examples of the computer readable medium include but are not limited to: an electronic connection (an electronic device) with one or more wires, a portable computer enclosure (a magnetic device), a random access memory (RAM), a read only memory (ROM), an erasable programmable read-only memory (EPROM or a flash memory), an optical fiber device and a portable compact disk read-only memory (CDROM). In addition, the computer readable medium may even be a paper or other appropriate medium capable of printing programs thereon, this is because, for example, the paper or other appropriate medium may be optically scanned and then edited, decrypted or processed with other appropriate methods when necessary to obtain the programs in an electric manner, and then the programs may be stored in the computer memories.

It should be understood that each part of the present disclosure may be realized by the hardware, software, firmware or their combination. In the above embodiments, a plurality of steps or methods may be realized by the software or firmware stored in the memory and executed by the appropriate instruction execution system. For example, if it is realized by the hardware, likewise in another embodiment, the steps or methods may be realized by one or a combination of the following techniques known in the art: a discrete logic circuit having a logic gate circuit for realizing a logic function of a data signal, an application-specific integrated circuit having an appropriate combination logic gate circuit, a programmable gate array (PGA), a field programmable gate array (FPGA), etc.

In the description of the specification, the description of the reference terms "an embodiment", "some embodiments", "an example", "a specific example" or "some examples" means that specific features, structures, materials, or characteristics described in combination with the embodiment(s) or example(s) are included in at least one embodiment or example of the present disclosure. In the specification, schematic expressions of the above terms do not necessarily refer to the same embodiment or example. Moreover, the specific features, structures, materials, or characteristics described may be combined in an appropriate manner in any one or more embodiments or examples.

Technical features of the above embodiments may be arbitrarily combined. To make the description concise, not all possible combinations of the technical features in the above embodiments are described. However, as long as there is no contradiction in the combinations of these technical features, they should be considered as the scope of the specification.

The above embodiments express only several embodiments of the present disclosure, and descriptions thereof are more specific and detailed, but they cannot be understood as limitations to the scope of the invention patent. It should be noted that a person of ordinary skill in the art can also make several variations and improvements without departing from the concept of the present disclosure, all of which fall within the protection scope of the present disclosure. Therefore, the protection scope of the invention patent should be subject to the appended claims.

What is claimed is:

1. An autonomous failure recovery method for a fiber-optic communication system, the autonomous failure recovery method comprising:
    acquiring a real-time operation timing of a digital high-speed serial transceiver of the fiber-optic communication system;
    comparing the real-time operation timing with a pre-stored reference timing of normal operation of the digital high-speed serial transceiver;
    determining a failure of an optical path of the fiber-optic communication system occurs when the operation timing is inconsistent with the pre-stored reference timing;
    transmitting, when the optical path is in a failure state, a pre-determined autonomous recovery timing to the digital high-speed serial transceiver; and
    performing an autonomous failure recovery operation of the fiber-optic communication system in response to the autonomous recovery timing.

2. The autonomous failure recovery method of claim 1, wherein the real-time operation timing includes a digital high-speed serial transceiver transmitting reset timing and a digital high-speed serial transceiver receiving reset timing.

3. The autonomous failure recovery method of claim 2, wherein the digital high-speed serial transceiver transmitting reset timing includes a transmitting physical medium attachment reset timing and a transmitting physical coding sub-layer reset timing.

4. The autonomous failure recovery method of claim 3, wherein when the operation timing is the digital high-speed serial transceiver transmitting reset timing, the step of transmitting the pre-determined autonomous recovery timing to the digital high-speed serial transceiver, and performing the autonomous failure recovery operation of the fiber-optic communication system in response to the autonomous recovery timing includes:
    transmitting a phase-locked loop reset timing to the digital high-speed serial transceiver, wherein the digital high-speed serial transceiver returns a phase-locked loop locking timing in response to a positive pulse of the phase-locked loop reset timing; and
    transmitting the transmitting physical medium attachment reset timing to the digital high-speed serial transceiver if a negative pulse of the phase-locked loop locking timing is detected, wherein after detecting the positive pulse of the transmitting physical medium attachment reset timing, the digital high-speed serial transceiver executes a transmitting physical medium attachment reset timing autonomous recovery process, and returns a high level of a transmitting user ready timing after the transmitting physical medium attachment reset timing autonomous recovery process ends.

5. The autonomous failure recovery method of claim 4, wherein when the operation timing is the digital high-speed serial transceiver transmitting reset timing, the step of transmitting the pre-determined autonomous recovery timing to the digital high-speed serial transceiver, and performing the autonomous failure recovery operation of the fiber-optic communication system in response to the autonomous recovery timing further includes:
    transmitting the transmitting physical coding sub-layer reset timing to the digital high-speed serial transceiver in response to the high level of the transmitting user ready timing, wherein after detecting a positive pulse of the transmitting physical coding sub-layer reset timing, the digital high-speed serial transceiver executes a transmitting physical coding sub-layer reset timing autonomous recovery process, and returns a high level of a transmitting reset-completion timing after the transmitting physical coding sub-layer reset timing autonomous recovery process ends.

6. The autonomous failure recovery method of claim 2, wherein the digital high-speed serial transceiver receiving reset timing includes a receiving physical medium attachment reset timing, a receiving low-power mode reset timing, and a receiving physical coding sub-layer reset timing.

7. The autonomous failure recovery method of claim 6, wherein the digital high-speed serial transceiver receiving reset timing further includes a receiving buffer reset timing.

8. The autonomous failure recovery method of claim 7, wherein when the operation timing is the digital high-speed serial transceiver receiving reset timing, the step of transmitting the pre-determined autonomous recovery timing to the digital high-speed serial transceiver, and performing the autonomous failure recovery operation of the fiber-optic communication system in response to the autonomous recovery timing includes:
    transmitting the receiving buffer reset timing to the digital high-speed serial transceiver in response to a high level of a receiving user ready timing, wherein after detecting a positive pulse of the receiving buffer reset timing, the digital high-speed serial transceiver executes a receiving buffer reset timing autonomous recovery process, and returns a high level of a receiving reset-completion timing after the receiving buffer reset timing autonomous recovery process ends.

9. The autonomous failure recovery method of claim 6, after transmitting the receiving physical medium attachment reset timing to the digital high-speed serial transceiver, further comprising:
    transmitting a dynamic re-preparation instruction and a dynamic re-preparation instruction ready timing to the digital high-speed serial transceiver.

10. The autonomous failure recovery method of claim 9, wherein after detecting a first positive pulse of the dynamic re-preparation instruction ready timing, the digital high-speed serial transceiver performs a writing-0 operation in response to the dynamic re-preparation instruction, and
    after detecting a second positive pulse of the dynamic re-preparation instruction ready timing, the digital high-speed serial transceiver performs a data recovery operation in response to the dynamic re-preparation instruction.

11. The autonomous failure recovery method of claim 6, wherein when the operation timing is the digital high-speed serial transceiver receiving reset timing, the step of transmitting the pre-determined autonomous recovery timing to the digital high-speed serial transceiver, and performing the autonomous failure recovery operation of the fiber-optic communication system in response to the autonomous recovery timing includes:
    transmitting a phase-locked loop reset timing to the digital high-speed serial transceiver, wherein the digital high-speed serial transceiver returns a phase-locked loop locking timing in response to a positive pulse of the phase-locked loop reset timing; and transmitting the receiving physical medium attachment reset timing to the digital high-speed serial transceiver if a negative pulse of the phase-locked loop locking timing is detected, wherein after detecting a positive pulse of the receiving physical medium attachment reset timing, the digital high-speed serial transceiver executes a receiving physical medium attachment reset timing autonomous recovery process, and returns a high level of a receiving physical medium attachment reset-completion timing after the receiving physical medium attachment reset timing autonomous recovery process ends.

12. The autonomous failure recovery method of claim 11, wherein when the operation timing is the digital high-speed serial transceiver receiving reset timing, the step of transmitting the pre-determined autonomous recovery timing to the digital high-speed serial transceiver, and performing the autonomous failure recovery operation of the fiber-optic communication system in response to the autonomous recovery timing further includes:

transmitting the receiving low-power mode reset timing to the digital high-speed serial transceiver in response to the high level of the receiving physical medium attachment reset-completion timing, wherein after detecting a positive pulse of the receiving low-power mode reset timing, the digital high-speed serial transceiver executes a receiving low-power mode reset timing autonomous recovery process, and returns a high level of a receiving user ready timing after the receiving low-power mode reset timing autonomous recovery process ends.

13. The autonomous failure recovery method of claim 12, wherein when the operation timing is the digital high-speed serial transceiver receiving reset timing, the step of transmitting the pre-determined autonomous recovery timing to the digital high-speed serial transceiver, and performing the autonomous failure recovery operation of the fiber-optic communication system in response to the autonomous recovery timing further includes:

transmitting the receiving physical coding sub-layer reset timing to the digital high-speed serial transceiver in response to the high level of the receiving user ready timing, wherein after detecting a positive pulse of the receiving physical coding sub-layer reset timing, the digital high-speed serial transceiver executes a receiving physical coding sub-layer reset timing autonomous recovery process, and returns a high level of a receiving reset-completion timing after the receiving physical coding sub-layer reset timing autonomous recovery process ends.

14. The autonomous failure recovery method of claim 1, further comprising:

sampling a real-time operating state parameter of an optical module to acquire a sample parameter, and performing level detection on the sample parameter to acquire a level detection value; and comparing the level detection value with a level reference value of normal operation of the optical path.

15. The autonomous failure recovery method of claim 14, further comprising:

reconfiguring a clock of the fiber-optic communication system, if the level detection value is inconsistent with the level reference value.

16. The autonomous failure recovery method of claim 14, further comprising:

powering off and restarting for a link, if the level detection value is inconsistent with the level reference value.

17. A computer-readable storage medium, storing a computer program, the computer program, when executed by a processor, implementing the autonomous failure recovery method of claim 1.

18. A computer device, comprising a memory, a processor, and a computer program stored on the memory and runnable in the processor, the computer program, when executed by the processor, implementing the autonomous failure recovery method of claim 1.

19. An autonomous failure recovery system for a fiber-optic communication system, the autonomous failure recovery system comprising:

a comparison module, configured to acquire a real-time operation timing of a digital high-speed serial transceiver of the fiber-optic communication system, and compare the operation timing with a pre-stored reference timing of normal operation of the digital high-speed serial transceiver;

a determination module, configured to determine a failure of an optical path of the fiber-optic communication system occurs when the operation timing is inconsistent with the pre-stored reference timing; and an autonomous recovery module, configured to transmit, when the optical path is in a failure state, a pre-determined autonomous recovery timing to the digital high-speed serial transceiver, and perform an autonomous failure recovery operation of the fiber-optic communication system in response to the autonomous recovery timing.

\* \* \* \* \*